(12) United States Patent
Lozhkin

(10) Patent No.: US 8,670,728 B2
(45) Date of Patent: *Mar. 11, 2014

(54) PHASE CORRECTION APPARATUS AND PHASE CORRECTION METHOD

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 406 days.

This patent is subject to a terminal disclaimer.

(21) Appl. No.: 12/814,788

(22) Filed: Jun. 14, 2010

(65) Prior Publication Data

US 2010/0323640 A1 Dec. 23, 2010

(30) Foreign Application Priority Data

Jun. 17, 2009 (JP) ................. 2009-144364

(51) Int. Cl.
*H04B 1/66* (2006.01)
(52) U.S. Cl.
USPC .......................... 455/102; 455/110
(58) Field of Classification Search
USPC .......... 455/102, 110, 118; 375/344, 279, 326, 375/329
See application file for complete search history.

(56) References Cited

U.S. PATENT DOCUMENTS

| | | | |
|---|---|---|---|
| 5,132,554 A * | 7/1992 | Hiramatsu et al. | 327/154 |
| 5,396,190 A | 3/1995 | Murata | |
| 5,557,335 A * | 9/1996 | Oh | 348/512 |
| 5,699,383 A | 12/1997 | Ichiyoshi | |
| 5,732,109 A * | 3/1998 | Takahashi | 375/326 |
| 5,796,786 A * | 8/1998 | Lee | 375/326 |
| 5,802,451 A | 9/1998 | Adachi et al. | |
| 5,894,496 A | 4/1999 | Jones | |
| 5,900,778 A | 5/1999 | Stonick et al. | |
| 6,081,698 A | 6/2000 | Moriyama et al. | |
| 6,212,244 B1 * | 4/2001 | Davidovici et al. | 455/239.1 |
| 6,418,173 B1 | 7/2002 | Matsuoka et al. | |
| 6,587,514 B1 | 7/2003 | Wright et al. | |

(Continued)

FOREIGN PATENT DOCUMENTS

| | | | |
|---|---|---|---|
| JP | 09064932 A | * | 3/1997 |
| JP | 2004-104580 | | 4/2004 |
| JP | 2008-152847 | | 7/2008 |

OTHER PUBLICATIONS

Joel L. Dawson, et al. "Automatic Phase Alignment for a Fully Integrated CMOS Cartesian Feedback Power Amplifier System" IEEE International Solid-State Circuits Conference, Jan. 2, 2003.

(Continued)

*Primary Examiner* — Lana N Le
(74) *Attorney, Agent, or Firm* — Katten Muchin Rosenman LLP

(57) ABSTRACT

A phase correction apparatus in a wireless transmitter includes a modulator configured to modulate an in-phase component and a quadrature component of a first signal by a first carrier wave signal, a demodulator configured to demodulate a returned signal by a second carrier wave signal and generate a second signal that includes an in-phase component and a quadrature component, a phase detector configured to binarize the in-phase components and the quadrature components of the first and second signals according to signal levels, and detect a phase error between the first signal and the second signal based on combinations of the binarized signal components in the first signal and the second signal, and a phase shifter configured to phase-shift the first signal, the second signal, the first carrier wave signal, or the second carrier wave signal, based on the phase error.

4 Claims, 10 Drawing Sheets

(56) References Cited

U.S. PATENT DOCUMENTS

| | | |
|---|---|---|
| 6,639,950 B1 | 10/2003 | Lagerblom et al. |
| 6,980,604 B2 | 12/2005 | Kubo et al. |
| 7,020,447 B2 | 3/2006 | Nagatani et al. |
| 7,177,366 B1 | 2/2007 | Dawson et al. |
| 7,382,834 B2 | 6/2008 | Dawson et al. |
| 7,433,420 B1 | 10/2008 | Dakshinamurthy et al. |
| 7,689,180 B2 | 3/2010 | Grundlingh et al. |
| 7,764,578 B2 | 7/2010 | Kurokawa et al. |
| 7,961,812 B2 | 6/2011 | Jensen et al. |
| RE43,105 E | 1/2012 | Kurokawa et al. |
| 8,175,551 B2 | 5/2012 | Akaiwa |
| 8,306,487 B2 | 11/2012 | Lozhkin |
| 8,385,852 B2 | 2/2013 | Lozhkin |
| 2008/0144460 A1 | 6/2008 | Kurokawa et al. |
| 2010/0323638 A1 | 12/2010 | Lozhkin |
| 2010/0323640 A1 | 12/2010 | Lozhkin |

OTHER PUBLICATIONS

Joel L. Dawson, et al. "Automatic Phase Alignment for a Fully Integrated Cartesian Feedback Power Amplifier System" IEEE Journal of Solid-State Circuits, vol. 38, No. 12, Dec. 2003.

Notice of Allowance with References Cited dated Aug. 31, 2012, from corresponding U.S. Appl. No. 12/813,806, now U.S. Patent 8,306,487.

Notice of Allowance dated Nov. 16, 2012, from corresponding U.S. Appl. No. 12/814,786, now U.S. Patent 8,385,852.

Ex parte Quayle dated Sep. 24, 2012, from corresponding U.S. Appl. No. 12/814,786, now U.S. Patent 8,385,852.

* cited by examiner

FIG. 4

| SIGN OF Q* | SIGN OF I | SIGN OF I* | SIGN OF Q | SIGN OF sin(Δφ) |
|---|---|---|---|---|
| − | − | − | − | INDEFINITE |
| − | − | − | + | + |
| − | − | + | − | + |
| − | − | + | + | INDEFINITE |
| − | + | − | − | − |
| − | + | − | + | INDEFINITE |
| − | + | + | − | INDEFINITE |
| − | + | + | + | − |
| + | − | − | − | − |
| + | − | − | + | INDEFINITE |
| + | − | + | − | INDEFINITE |
| + | − | + | + | − |
| + | + | − | − | INDEFINITE |
| + | + | − | + | + |
| + | + | + | − | + |
| + | + | + | + | INDEFINITE |

FIG. 6

| OUTPUT OF COMPARATOR 51-1 | OUTPUT OF COMPARATOR 51-2 | OUTPUT OF COMPARATOR 51-3 | OUTPUT OF COMPARATOR 51-4 | SIGN OF $\sin(\Delta\phi)$ | ROM ADDRESS | $\sin(\Delta\phi)$ ROM VALUE $D_0$ (SU) | $\sin(\Delta\phi)$ ROM VALUE $D_1$ (SD) |
|---|---|---|---|---|---|---|---|
| 0 | 0 | 0 | 0 | INDEFINITE | 0 | X | X |
| 0 | 0 | 0 | 1 | + | 1 | 1 | 0 |
| 0 | 0 | 1 | 0 | + | 2 | 1 | 0 |
| 0 | 0 | 1 | 1 | INDEFINITE | 3 | X | X |
| 0 | 1 | 0 | 0 | − | 4 | 0 | 1 |
| 0 | 1 | 0 | 1 | INDEFINITE | 5 | X | X |
| 0 | 1 | 1 | 0 | INDEFINITE | 6 | X | X |
| 0 | 1 | 1 | 1 | − | 7 | 0 | 1 |
| 1 | 0 | 0 | 0 | − | 8 | 0 | 1 |
| 1 | 0 | 0 | 1 | INDEFINITE | 9 | X | X |
| 1 | 0 | 1 | 0 | INDEFINITE | 10 | X | X |
| 1 | 0 | 1 | 1 | − | 11 | 0 | 1 |
| 1 | 1 | 0 | 0 | INDEFINITE | 12 | X | X |
| 1 | 1 | 0 | 1 | + | 13 | 1 | 0 |
| 1 | 1 | 1 | 0 | + | 14 | 1 | 0 |
| 1 | 1 | 1 | 1 | INDEFINITE | 15 | X | X |

FIG. 7

| INPUT | | OUTPUT |
|---|---|---|
| SU | SD | (CONTROLLED VOLTAGE) |
| 1 | 0 | INCREASE |
| 0 | 1 | DECREASE |
| X | X | KEEP |

FIG. 8

| SIGN OF Q* | SIGN OF I | SIGN OF I* | SIGN OF Q | SIGN OF sin(Δφ) | SIGN OF cos(Δφ) |
|---|---|---|---|---|---|
| − | − | − | − | INDEFINITE | + |
| − | − | − | + | + | INDEFINITE |
| − | − | + | − | + | INDEFINITE |
| − | − | + | + | INDEFINITE | − |
| − | + | − | − | − | INDEFINITE |
| − | + | − | + | INDEFINITE | − |
| − | + | + | − | INDEFINITE | + |
| − | + | + | + | − | INDEFINITE |
| + | − | − | − | − | INDEFINITE |
| + | − | − | + | INDEFINITE | + |
| + | − | + | − | INDEFINITE | − |
| + | − | + | + | − | INDEFINITE |
| + | + | − | − | INDEFINITE | − |
| + | + | − | + | + | INDEFINITE |
| + | + | + | − | + | INDEFINITE |
| + | + | + | + | INDEFINITE | + |

FIG. 10

| OUTPUT OF COMPARATOR 51-1 | OUTPUT OF COMPARATOR 51-2 | OUTPUT OF COMPARATOR 51-3 | OUTPUT OF COMPARATOR 51-4 | SIGN OF $\sin(\Delta\phi)$ | SIGN OF $\cos(\Delta\phi)$ | ROM ADDRESS | $\sin(\Delta\phi)$ ROM VALUE $D_0$ (SU) | $\sin(\Delta\phi)$ ROM VALUE $D_1$ (SD) | $\cos(\Delta\phi)$ ROM VALUE $D_0$ (SU) | $\cos(\Delta\phi)$ ROM VALUE $D_1$ (SD) |
|---|---|---|---|---|---|---|---|---|---|---|
| 0 | 0 | 0 | 0 | INDEFINITE | + | 0 | X | X | 1 | 0 |
| 0 | 0 | 0 | 1 | + | INDEFINITE | 1 | 1 | 0 | X | X |
| 0 | 0 | 1 | 0 | + | INDEFINITE | 2 | 1 | 0 | X | X |
| 0 | 0 | 1 | 1 | INDEFINITE | − | 3 | X | X | 0 | 1 |
| 0 | 1 | 0 | 0 | − | INDEFINITE | 4 | 0 | 1 | X | X |
| 0 | 1 | 0 | 1 | INDEFINITE | + | 5 | X | X | 1 | 0 |
| 0 | 1 | 1 | 0 | INDEFINITE | − | 6 | X | X | 0 | 1 |
| 0 | 1 | 1 | 1 | − | INDEFINITE | 7 | 0 | 1 | X | X |
| 1 | 0 | 0 | 0 | INDEFINITE | + | 8 | X | X | 1 | 0 |
| 1 | 0 | 0 | 1 | INDEFINITE | − | 9 | X | X | 0 | 1 |
| 1 | 0 | 1 | 0 | INDEFINITE | + | 10 | X | X | 1 | 0 |
| 1 | 0 | 1 | 1 | + | INDEFINITE | 11 | 1 | 0 | X | X |
| 1 | 1 | 0 | 0 | INDEFINITE | − | 12 | X | X | 0 | 1 |
| 1 | 1 | 0 | 1 | + | INDEFINITE | 13 | 1 | 0 | X | X |
| 1 | 1 | 1 | 0 | + | INDEFINITE | 14 | 1 | 0 | X | X |
| 1 | 1 | 1 | 1 | INDEFINITE | + | 15 | X | X | 1 | 0 |

PHASE CORRECTION APPARATUS AND PHASE CORRECTION METHOD

CROSS-REFERENCE TO RELATED APPLICATION

This application is based upon and claims the benefit of priority of the prior Japanese Patent Application No. 2009-144364, filed on Jun. 17, 2009, the entire contents of which are incorporated herein by reference.

FIELD

Embodiments of the present invention relate to a phase correction technology used for a wireless transmitter.

BACKGROUND

There is a general limit to the linearity of an output signal from a power amplifier used for wireless transmission. Particularly, when the level of the input signal is large, a reduction in gain occurs (i.e., non-linear distortion). Cartesian feedback linearization apparatuses have been established as one type of circuit that compensates for such non-linear distortion. If a Cartesian feedback linearization apparatus is functioning ideally, then a high degree of linearity is achieved in the output signal from the power amplifier.

In a Cartesian feedback linearization apparatus, the output signal from the power amplifier is taken and fed back into the input side. At this point, feedback-related phase changes are produced due to factors such as, for example, effects on antenna load and propagation delays in directional couplers and demodulators. Accordingly, it is desirable to correct such feedback-related phase changes in order to enable effective operation of the Cartesian feedback linearization apparatus.

From this perspective, there exists a phase correction apparatus applied to a Cartesian feedback linearization apparatus. FIG. 1 illustrates the core configuration of such a phase correction apparatus.

In FIG. 1, the in-phase component I and the quadrature component Q of a transmission baseband signal are modulated by a quadrature modulator 40 before being combined. The combined signal is then amplified to a desired level by a power amplifier (PA) 90, and transmitted as an RF signal (RF_OUT). In addition, part of the RF signal (RF_OUT) is taken (i.e., fed back) by a directional coupler, and from this feedback signal y(t) a baseband signal (in-phase component I*, quadrature component Q*) is generated by a quadrature demodulator 30. Due to the feedback-related phase changes described above, I≠I*, and Q≠Q* (in FIG. 1, the delay equivalent to the phase changes is expressed as the delay time τ). For this reason, a phase correction apparatus for correcting the phase changes is provided.

In FIG. 1, the phase correction apparatus is provided with a phase detector and a phase shifter 104. The phase detector includes a sine detector 101 and a cosine detector 102. If the target correction amount for the phase (i.e., the phase error) is taken to be $\Delta\phi$, then the fed-back baseband signal (in-phase component I*, quadrature component Q*) is expressed by the following Eqs. 1 and 2. In Eqs. 1 and 2, the relationships I=I* and Q=Q* hold true only when $\Delta\phi=0$. In addition, $\sin(\Delta\phi)$ is computed in the sine detector 101 according to the following Eq. 3. Herein, k in Eq. 3 is a normalization constant, where $k=1/(I\cdot I+Q\cdot Q)$.

$$I^* = I\cdot\cos(\Delta\phi) + Q\cdot\sin(-\Delta\phi) \quad (1)$$

$$Q^* = I\cdot\sin(\Delta\phi) + Q\cdot\cos(\Delta\phi) \quad (2)$$

$$\sin(\Delta\phi) = k\cdot(I\cdot Q^* - Q\cdot I^*) \quad (3)$$

The cosine detector 102 computes $\cos(\Delta\phi)$ according to the relationship $\cos(\Delta\phi) = (1-\sin^2(\Delta\phi))^{1/2}$. The cosine detector 102 is also configured such that the sum of the squares of the input into the phase shifter 104 becomes a predetermined constant Mag. In so doing, the amplitude of the output signal from the phase shifter 104 is compensated so as to become fixed.

As illustrated by the following Eq. 4, the phase shifter 104 takes both a carrier wave signal $\sin(\omega t)$ from a local oscillator, as well as a signal obtained by phase-shifting the carrier wave signal by $\pi/2$. The phase shifter 104 multiplies the above signals by $\cos(\Delta\phi)$ and $\sin(\Delta\phi)$, respectively, and then combines the result. As a result, the quadrature modulator 40 is supplied with the signal $\sin(\omega t + \Delta\phi)$, which is equivalent to the carrier wave signal $\sin(\omega t)$ from the local oscillator being phase-shifted forward by $\Delta\phi$. Consequently, the phase error becomes 0 (i.e., $\Delta\phi=0$) between the RF signal y(t) that was fed back from the output of the wireless transmitter, and the carrier wave signal supplied by the quadrature modulator 40.

$$\cos(\Delta\phi)\cdot\sin(\omega\cdot t) + \sin(\Delta\phi)\cdot\cos(\omega\cdot t) = \sin(\omega\cdot t + \Delta\phi) \quad (4)$$

However, the phase correction apparatus described with reference to FIG. 1 is configured such that the phase detector and the phase shifter are realized by analog circuits. For this reason, operation might become unstable, due to factors such as temperature drift in the characteristics of elements within the analog circuits, and offset characteristics produced at the time of manufacturing.

SUMMARY

According to an aspect of the embodiments discussed herein, a phase correction apparatus in a wireless transmitter for converting a first signal into a wireless signal and amplifying the wireless signal by a power amplifier, the phase correction apparatus includes a quadrature modulator configured to modulate the in-phase component and the quadrature component of the first signal by a first carrier wave signal, a quadrature demodulator configured to demodulate a returned signal returned from an output of the power amplifier by a second carrier wave signal, and thereby generate a second signal that includes an in-phase component and a quadrature component, a phase detector configured to binarize the in-phase components and the quadrature components of the first and second signals according to signal levels, and detect a phase error between the first signal and the second signal based on combinations of the binarized signal components in the first signal and the second signal, and a phase shifter configured to phase-shift the first signal, the second signal, the first carrier wave signal, or the second carrier wave signal, based on the phase error.

It is to be understood that both the foregoing general description and the following detailed description are exemplary and explanatory and are not restrictive of the embodiments, as claimed.

BRIEF DESCRIPTION OF DRAWINGS

FIG. 4 illustrates relationships between the signs of the respective signal components in the transmission baseband signal and the fed-back baseband signal, and the sign of the sine of the phase error in the first embodiment;

FIG. 6 illustrates an exemplary configuration of ROM provided in a phase detector in the first embodiment;

FIG. 7 illustrates relationships among the inputs and outputs of an integrator provided in a phase detector in the first embodiment;

FIG. 8 illustrates relationships between the signs of the respective signal components in the transmission baseband signal and the fed-back baseband signal, and the signs of the sine and the cosine of the phase error in the second embodiment;

FIG. 10 illustrates an exemplary configuration of ROM provided in a phase detector in the second embodiment.

DESCRIPTION OF EMBODIMENTS (First Embodiment)

Hereinafter, a wireless transmitter provided with a Cartesian feedback linearization apparatus that compensates for non-linear distortion in the power amplifier will be described. The Cartesian feedback linearization apparatus herein adopts a phase correction apparatus.

(1-1) Overall Configuration of Wireless Transmitter

Figure 1:
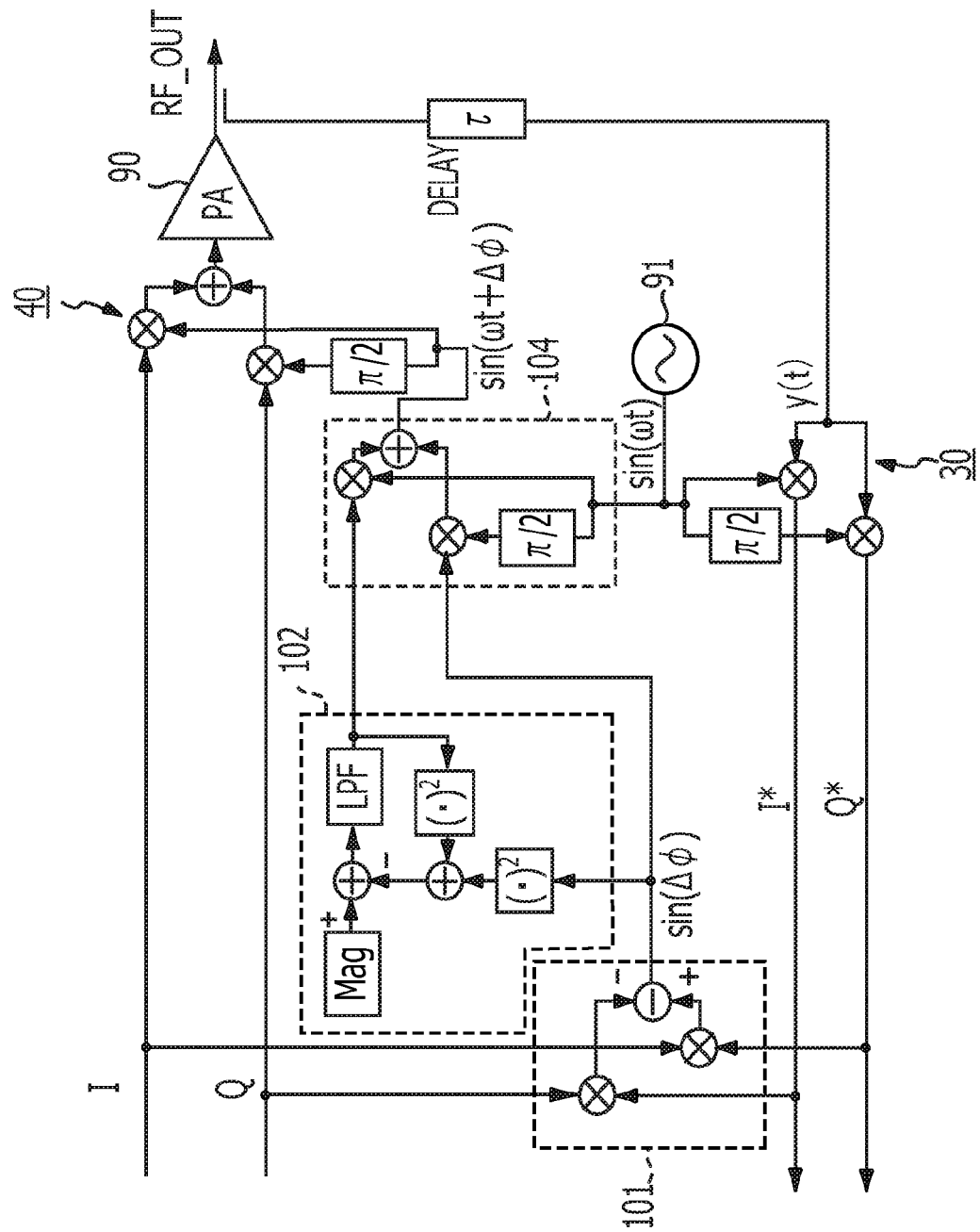
FIG. 1 is a block diagram illustrating an example of a related phase correction apparatus.
Figure 2:
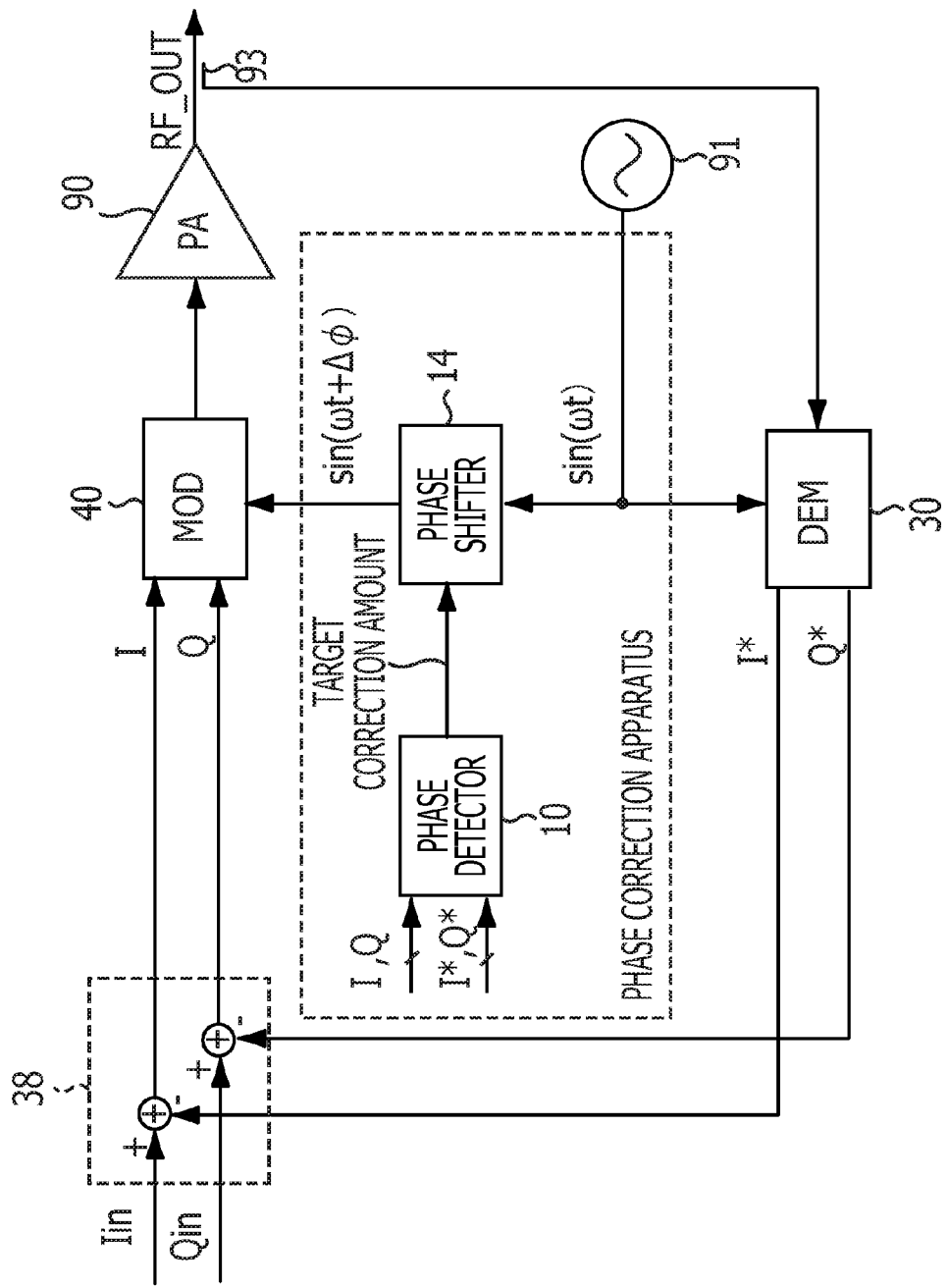
FIG. 2 is a block diagram illustrating the overall core configuration of a wireless transmitter in the first embodiment.

Hereinafter, the overall configuration of the wireless transmitter in the first embodiment will be described with reference to FIG. 2. FIG. 2 is a block diagram illustrating the overall core configuration of a wireless transmitter in the first embodiment. The wireless transmitter illustrated in FIG. 2 includes a phase detector 10, a phase shifter 14, a quadrature demodulator (DEM) 30, a subtractor 38, a quadrature modulator (MOD) 40, a power amplifier (PA) 90, a local oscillator 91, and a directional coupler 93. In FIG. 2, a carrier wave signal generated by the local oscillator 91 is provided to the quadrature demodulator 30. The carrier wave signal provided to the quadrature modulator 40 from the local oscillator 91 is phase-rotated by the phase shifter 14.

In the wireless transmitter illustrated in FIG. 2, the RF signal (RF_OUT) output by the power amplifier 90 is taken by the directional coupler 93 and used by the quadrature demodulator 30 to generate a baseband signal (in-phase component I*, quadrature component Q*). This baseband signal (in-phase component I*, quadrature component Q*) is fed back into the subtractor 38. In the subtractor 38, the fed-back baseband signal (in-phase component I*, quadrature component Q*) is subtracted from the input baseband signal (in-phase component $I_{in}$, quadrature component $Q_{in}$). The error signal obtained by the subtractor 38 is directed toward the quadrature modulator 40. In so doing, Cartesian feedback is formed.

In this description of the present embodiment, the baseband signal that is input into the quadrature modulator 40 is referred to as the transmission baseband signal (in-phase component I, quadrature component Q). The transmission baseband signal is the signal obtained after the error signal obtained by the subtractor 38 has passed through predetermined propagation elements (not illustrated) for amplification. The transmission baseband signal (in-phase component I, quadrature component Q) and the fed-back baseband signal (in-phase component I*, quadrature component Q*) are input into the phase detector 10.

The phase detector 10 detects the phase error based on the transmission baseband signal (in-phase component I, quadrature component Q) and the fed-back baseband signal (in-phase component I*, quadrature component Q*), and supplies the detected phase error to the phase shifter 14 as the target correction amount (i.e., target value). The phase shifter 14 shifts the phase of the carrier wave signal from the local oscillator 91 with respect to the quadrature modulator 40 by the target correction amount supplied by the phase detector 10. In so doing, phase changes produced by feedback-related factors are corrected, and the Cartesian feedback linearizing apparatus is made to function effectively.

(1-2) Configuration of Phase Correction Apparatus

Figure 3:
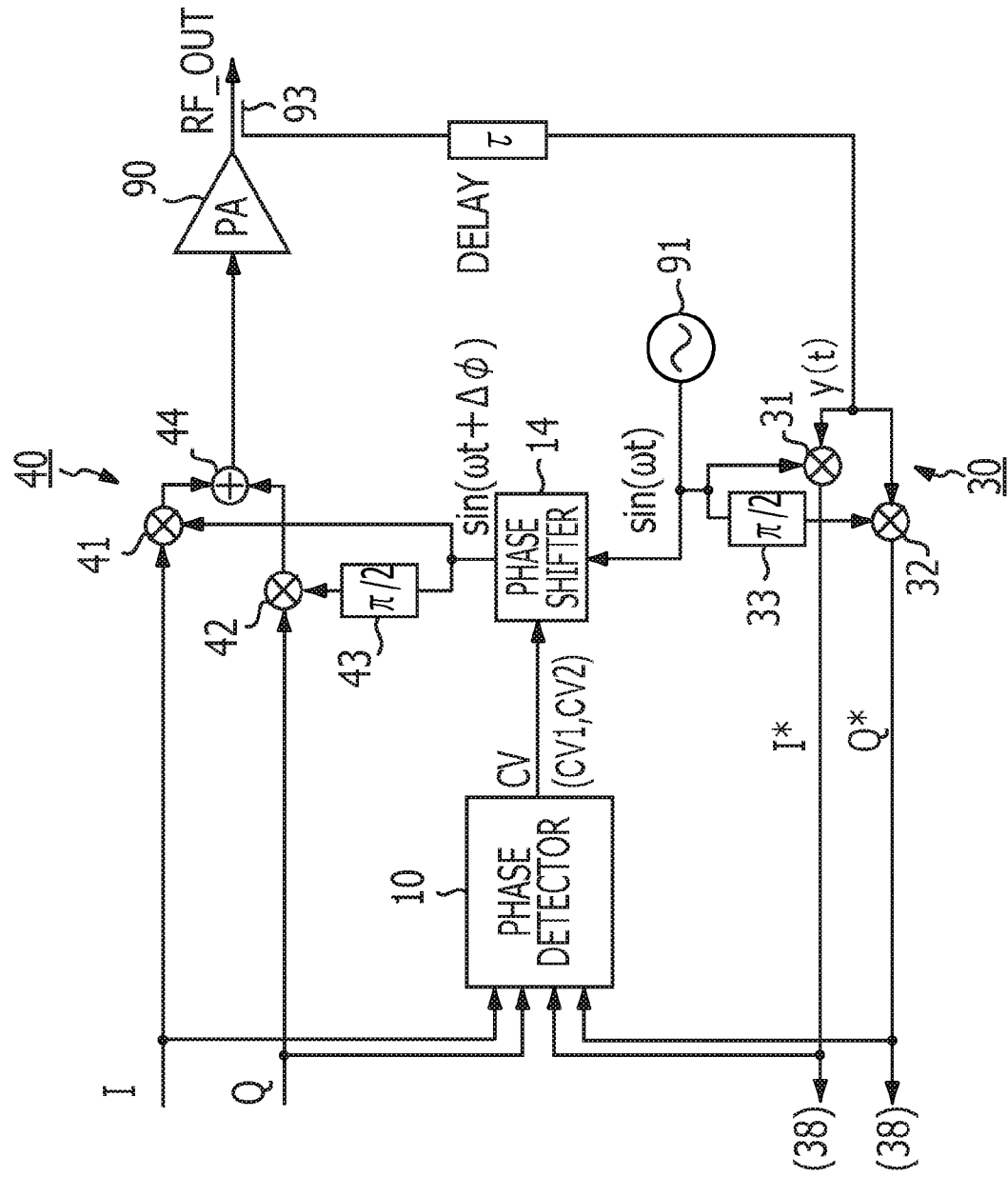
FIG. 3 is a block diagram of a wireless transmitter in the first embodiment, herein illustrating only the parts related to a phase correction apparatus.

The configuration of the phase correction apparatus will now be described with reference to FIG. 3. FIG. 3 is a block diagram of the wireless transmitter in the first embodiment, herein illustrating only the parts related to the phase correction apparatus. In other words, unlike FIG. 2, FIG. 3 does not illustrate the entire configuration related to Cartesian feedback.

In FIG. 3, τ is used to express the delay element of the RF signal that was taken from the directional coupler 93 and fed back. Also, as illustrated in FIG. 3, the quadrature demodulator 30 is provided with a mixer 31, a mixer 32, and a π/2 phase shifter 33, while the quadrature modulator 40 is provided with a mixer 41, a mixer 42, a π/2 phase shifter 43, and an adder 44.

The mixer 31 multiplies the fed-back RF signal y(t) (i.e., the returned signal) by the carrier wave signal sin(ωt) (i.e., the second carrier wave signal) from the local oscillator 91, thereby generating the in-phase component I* of the fed-back baseband signal (i.e., the second signal). The mixer 32 multiplies the fed-back RF signal y(t) by a signal obtained by phase-shifting the carrier wave signal sin(ωt) (i.e., the second carrier wave signal) from the local oscillator 91 by π/2, thereby generating the quadrature component Q* of the fed-back baseband signal (i.e., the second signal).

The carrier wave signal (i.e., the first carrier wave signal) provided to the quadrature modulator 40 has its phase shifted Δφ by the phase shifter 14 (i.e., sin(ωt+Δφ)). The mixer 41 multiplies the in-phase component I of the transmission baseband signal (i.e., the first signal) by the carrier wave signal sin(ωt+Δφ). The mixer 42 multiplies the quadrature component Q of the transmission baseband signal (i.e., the first signal) by the π/2 phase-shifted carrier wave signal sin(ωt+Δφ). The adder 44 adds the output signals from the mixer 41 and the mixer 42, and supplies the result to the power amplifier 90.

Based on the respective signal components in the transmission baseband signal (in-phase component I, quadrature component Q) and the fed-back baseband signal (in-phase component I*, quadrature component Q*), the phase detector 10 sets a control voltage (CV) that is provided to the phase shifter 14. This control voltage CV is the value corresponding to sin(Δφ) when the phase error between the transmission baseband signal and the fed-back baseband signal is Δφ.

In the phase shifter 14, the carrier wave signal sin(ωt) from the local oscillator 91 is phase-shifted by an amount based on the control voltage CV from the phase detector 10, and a carrier wave signal sin(ωt+Δφ) with respect to the quadrature modulator 40 is generated. In the first embodiment, the phase shifter 14 may be any means for shifting a phase according to the value of a provided control voltage, and its configuration is not limited. In the present embodiment, phase shifting is conducted based on just the value of $\sin(\Delta\phi)$ (in other words, the value of $\cos(\Delta\phi)$ is not used). For this reason, phase shifting is valid for a phase error $\Delta\phi$ in the range $-\pi/2<\Delta\phi<+\pi/2$. When the phase error $\Delta\phi$ is in the range $-\pi/2<\Delta\phi<+\pi/2$, $\sin(\Delta\phi)$ and $\Delta\phi$ are considered approximately equal, and the phase shifter 14 may be configured to produce a phase shift by an amount proportional to the control voltage CV.

(1-3) Digital Processing for Phase Detection

In the phase correction apparatus of the first embodiment, the phase detector 10 conducts phase detection by digital processing. This digital processing method will now be described with reference to FIG. 4. FIG. 4 illustrates relationships between the signs of the respective signal components in the transmission baseband signal (in-phase component I, quadrature component Q) and the fed-back baseband signal (in-phase component I*, quadrature component Q*), and the sign of $\sin(\Delta\phi)$ (where $\Delta\phi$ is the phase error). These relationships may be obtained using the earlier Eq. 3. In FIG. 4 herein, the sign of $\sin(\Delta\phi)$ may be marked "INDEFINITE", which means that the sign of $\sin(\Delta\phi)$ is not definitely determined with only the signs of I, Q, I*, and Q*. For example, when I, Q, I*, and Q* are all negative (−), the term $(I \cdot Q^* - Q \cdot I^*)$ in Eq. 3 might be either positive (+) or negative (−), and thus the sign of $\sin(\Delta\phi)$ becomes indefinite in this case. As illustrated in FIG. 4, the phase detector 10 successively detects the signs of the respective components I, Q, I*, and Q*. If the sign of $\sin(\Delta\phi)$ is positive (+), then the phase detector 10 increases the value of the control voltage CV by a predetermined amount. If the sign of $\sin(\Delta\phi)$ is negative (−), then the phase detector 10 decreases the control voltage CV by a predetermined amount. If the sign of $\sin(\Delta\phi)$ is indefinite, then the phase detector 10 keeps the value of the control voltage CV.

(1-4) Specific Exemplary Configuration of Phase Detector

Figure 5:
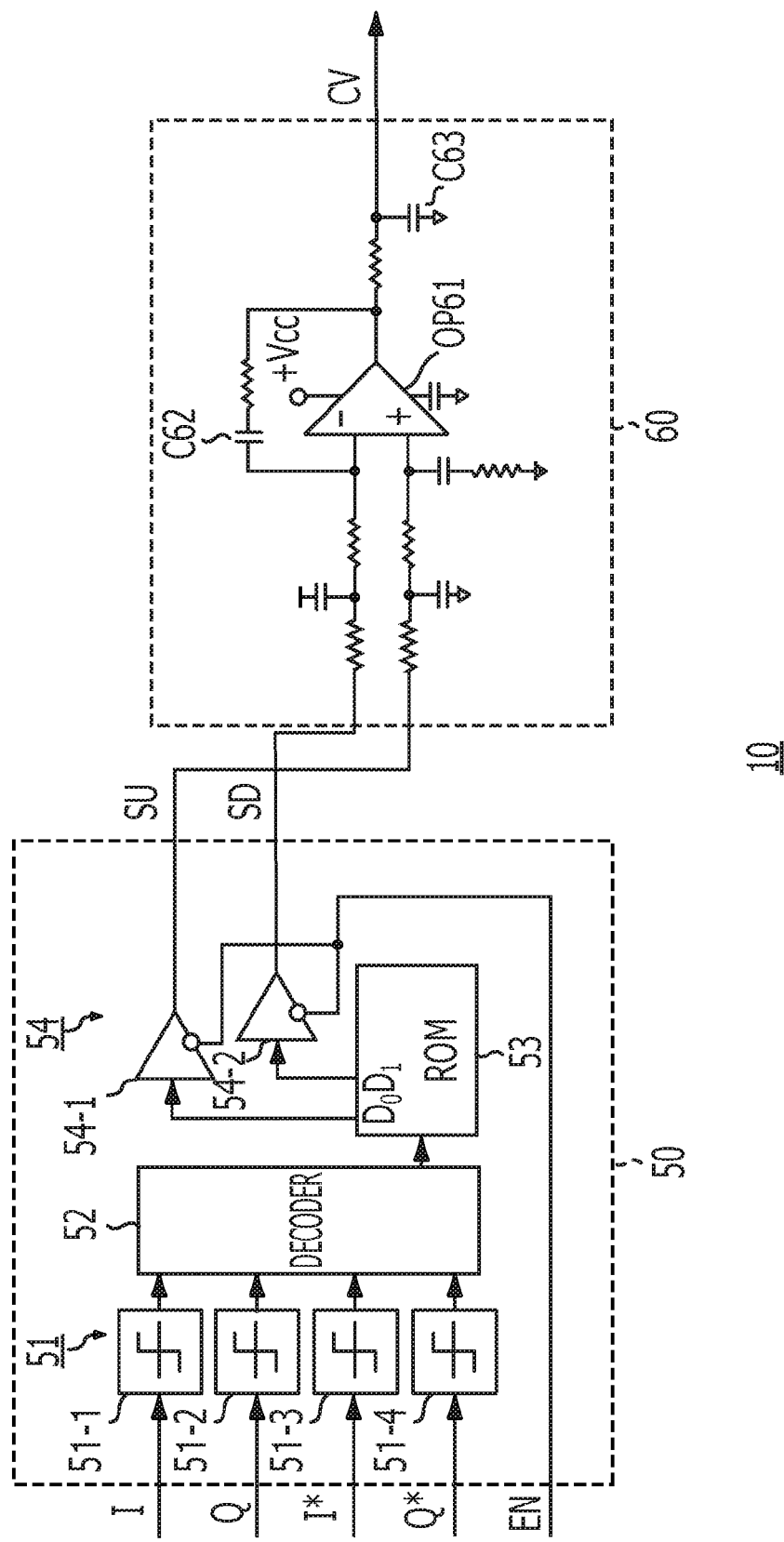
FIG. 5 is a block diagram illustrating a specific, exemplary configuration of a phase detector in the first embodiment.

A specific, exemplary configuration of the phase detector 10 will now be described with reference to FIGS. 5 to 7. FIG. 5 is a block diagram illustrating a specific, exemplary configuration of the phase detector 10. FIG. 6 illustrates an exemplary configuration of ROM provided in the phase detector 10 illustrated in FIG. 5. FIG. 7 illustrates relationships among the inputs and outputs of an integrator provided in the phase detector 10.

The phase detector 10 includes a digital processor 50 and an integrator 60. The digital processor 50 is provided with a comparator group 51 (comparators 51-1 to 51-4), a decoder 52, ROM 53 that acts as a first memory, and a buffer group 54 (buffers 54-1 and 54-2). The integrator 60 is provided with an op-amp OP61, as well as resistive elements and capacitors (such as the capacitors C62 and C63), which are connected to the input terminal or the output terminal of the op-amp OP61.

In the digital processor 50, the individual comparators of the comparator group 51 binarize the input signal. In other words, the comparator 51-1 compares the signal level (i.e., the voltage amplitude level, for example) of the in-phase component I of the transmission baseband signal to a predetermined threshold value, outputting a logic level of 1 if the I signal level is greater than the threshold value, and outputting a logic level of 0 if less than or equal to the threshold value. The comparator 51-2 compares the signal level of the quadrature component Q of the transmission baseband signal to a predetermined threshold value, outputting a logic level of 1 if the Q signal level is greater than the threshold value, and outputting a logic level of 0 if less than or equal to the threshold value. The comparator 51-3 compares the signal level of the in-phase component I* of the fed-back baseband signal to a predetermined threshold value, outputting a logic level of 1 if the I* signal level is greater than the threshold value, and outputting a logic level of 0 if less than or equal to the threshold value. The comparator 51-4 compares the signal level of the quadrature component Q* of the fed-back baseband signal to a predetermined threshold value, outputting a logic level of 1 if the Q* signal level is greater than the threshold value, and outputting a logic level of 0 if less than or equal to the threshold value.

Herein, the threshold value in each comparator is preferably 0 (zero). In the case where the threshold value in each comparator is 0, each comparator outputs 1 (when the input signal is positive (+)), or 0 (when the input signal is negative (−)) according to the sign of the input signal. In this case, the relationships between the comparator output and the sign of $\sin(\Delta\phi)$ illustrated in FIG. 6 are equivalent to the relationships illustrated in FIG. 4. However, the threshold value in each comparator is not limited to being 0, and may be set to other values in consideration of factors such as the offset in the baseband signal. In this case, the sign of each component illustrated in FIG. 4 may be taken to indicate the relative magnitude based on a predetermined threshold value, which is not limited to 0. Even when setting a threshold value to a value other than 0, the threshold value may be any value that enables determination of $\sin(\Delta\phi)$ variation, or in other words, determination of whether or not to increase or decrease the control voltage CV.

The decoder 52 converts the output from the comparators 51-1 to 51-4 (i.e., a 4-bit parallel signal) into an address value for the ROM 53. In FIG. 6, relationships between combinations of the outputs from the individual comparators (0 or 1) and ROM addresses are defined. In the decoder 52, ROM addresses are set in accordance with these relationships.

As illustrated in FIG. 6, the ROM 53 stores the 2-bit data $D_0$ and $D_1$ for each ROM address. The 2-bit data $D_0$ and $D_1$ (i.e., logic levels) corresponding to a ROM address set by the decoder 52 is then output from the ROM 53. The data in the ROM 53 is set according to the following standard. As illustrated in FIG. 6, the value of the control voltage CV ($\sin(\Delta\phi)$) is determined to be increased by a predetermined amount, decreased by a predetermined amount, or kept the same, according to the outputs from the individual comparators. When the sign of $\sin(\Delta\phi)$ is positive (+), the output data from the ROM 53 is set to be $D_0=1$ and $D_1=0$. When the sign of $\sin(\Delta\phi)$ is negative (−), the output data from the ROM 53 is set to be $D_0=0$ and $D_1=1$. When the sign of $\sin(\Delta\phi)$ is indefinite, the output data from the ROM 53 is set to be $D_0=X$ and $D_1=X$ (i.e., both are set to high impedance).

The buffers 54-1 and 54-2 are respective output buffers for outputting the data $D_0$ and $D_1$ from the ROM 53 to the integrator 60. Each buffer is controlled by an external enable signal EN to output the logic level of the data from the ROM 53 as-is, or to set the output to high impedance. For example, when the enable signal EN is low, the buffers may output the data $D_0$ and $D_1$ to the integrator 60 as-is, in the form of the signals SU and SD. When the enable signal EN is high, the buffers may set the data $D_0$ and $D_1$, or in other words the signal SU and SD, to high impedance.

As illustrated in FIG. 5, in the integrator 60, a capacitor C62 is provided on a return loop that connects the output terminal and inverted input terminal of the op-amp OP61. An integrator circuit is formed by this capacitor C62 and a resistive element connected to the input terminal of the op-amp OP61. A capacitor C63 for retaining the control voltage CV is connected to the output terminal of the op-amp OP61 via a resistive element. In the integrator 60, the polarity of the integrated result is inverted with respect to the input signal, and thus the signals SU and SD from the digital processor 50 are input into the non-inverted input terminal and the inverted input terminal of the op-amp OP61, respectively. Herein, when adapting this phase correction apparatus to an actual system, the gain and frequency characteristics of the control voltage CV may be adjusted by the resistive elements and capacitors provided in the integrator 60.

Referring now to FIG. 7, the integrator 60 operates as follows according to the values of the input signals SU and SD. When SU=1 ($D_0$=1) and SD=0 ($D_1$=0) in the integrator 60, the control voltage CV is increased by a predetermined amount. When SU=0 ($D_0$=0) and SD=1 ($D_1$=1) in the integrator 60, the control voltage CV is decreased by a predetermined amount. When the input is high impedance ($D_0$=X and $D_1$=X) in the integrator 60, the value of the control voltage CV is kept the same.

(1-5) Phase Correction Operation

Phase correction operation in the wireless transmitter in the first embodiment will now be described, primarily with reference to FIGS. 3 and 5. Referring now to FIG. 3, in the wireless transmitter in the first embodiment, the transmission baseband signal (in-phase component I, quadrature component Q) is first modulated by the quadrature modulator 40, amplified to a desired level by the power amplifier 90, and then broadcast. At this point, non-linear distortion is compensated for in the power amplifier 90, and thus the output signal RF_OUT from the power amplifier 90 is taken by the directional coupler 93 and fed back as the RF signal y(t) (i.e., Cartesian feedback). The signal fed back into the quadrature demodulator 30 is delayed compared to the output signal from the quadrature modulator 40, for example, due to feedback-related delay elements. Consequently, phase error might be produced between the transmission baseband signal (in-phase component I, quadrature component Q) and the fed-back baseband signal (in-phase component I*, quadrature component Q*) obtained by the quadrature demodulator 30. In order to correct such phase error, the respective signal components are first input into the phase detector 10.

Referring now to FIG. 5, in the phase detector 10, the respective input signal components (I, Q, I*, Q*) are first binarized (i.e., digitized) in the digital processor 50 by being compared to predetermined threshold values. Data is also stored in advance in the ROM 53 provided in the digital processor 50. Given a phase error of $\Delta\phi$, such data indicates whether to increase, decrease, or keep the value of sin($\Delta\phi$), based on combinations of the digitized signal components (see FIG. 6). In the digital processor 50, the individual component signals (I, Q, I*, Q*) are successively acquired, and the corresponding 2-bit data ($D_0$, $D_1$) is acquired from the ROM 53. This ROM data is supplied to the integrator 60 via a buffer as a signal of predetermined amplitude level (i.e., a signal with the same logic level as the ROM data). In the integrator 60, the output voltage (i.e., the control voltage CV) is increased, decreased, or kept the same (i.e., continuously updated) with respect to the phase shifter 14, based on the signal from the buffer. In this way, given a phase error of $\Delta\phi$, a control voltage CV corresponding to the value of sin($\Delta\phi$) is provided to the phase shifter 14.

The phase shifter 14 phase-shifts the carrier wave signal sin($\omega$t) from the local oscillator 91 in accordance with the magnitude of the control voltage CV from the phase detector 10, thereby generating a carrier wave signal sin($\omega$t+$\Delta\phi$) with respect to the quadrature modulator 40. In so doing, the phase of the carrier wave signal provided to the quadrature modulator 40 is corrected.

As described above, when detecting the phase error in the wireless transmitter of the first embodiment, both a transmission baseband signal (in-phase component I, quadrature component Q) as well as a fed-back baseband signal (in-phase component I*, quadrature component Q*) are digitized (i.e., binarized). Subsequently, the sine sin($\Delta\phi$) of the phase error $\Delta\phi$ is detected based on the digitized signals, and the phase of the carrier wave signal is corrected based on a control voltage that corresponds to sin($\Delta\phi$). In other words, since a control voltage is determined after digitizing the signals acquired by the phase correction apparatus, unstable operation caused by analog circuits is significantly suppressed, and the stability of phase correction operations is improved.

(Second Embodiment)

Hereinafter, a wireless transmitter that includes a phase correction apparatus in accordance with another embodiment will be described. A block diagram of the phase correction apparatus of the second embodiment is identical to that illustrated in FIG. 3. However, the output from the phase detector 10 in FIG. 3 becomes the control voltages CV1 and CV2 in the second embodiment.

(2-1) Digital Processing for Phase Detection

First, in the phase correction apparatus of the second embodiment, phase detection is conducted by digital processing, similarly to the first embodiment. This digital processing method will now be described with reference to FIG. 8. FIG. 8 illustrates relationships between the signs of the respective signal components in the transmission baseband signal (in-phase component I, quadrature component Q) and the fed-back baseband signal (in-phase component I*, quadrature component Q*), and the signs of sin($\Delta\phi$) and cos($\Delta\phi$) (where $\Delta\phi$ is the phase error). These relationships may be obtained using the formula for sin($\Delta\phi$) in the earlier Eq. 3, as well as the following Eq. 5.

$$\cos(\Delta\phi)=k \cdot (I \cdot I^* + Q \cdot Q^*) \quad (5)$$

Similarly to the case of FIG. 4 described earlier, in FIG. 8 herein, the sign of sin($\Delta\phi$) or cos($\Delta\phi$) may be marked "INDEFINITE", which means that the sign of sin($\Delta\phi$) or cos($\Delta\phi$) is not definitely determined with only the signs of I, Q, I*, and Q*. As illustrated in FIG. 8, the phase detector in the second embodiment detects the signs of the individual components I, Q, I*, and Q*, and successively detects the signs of sin($\Delta\phi$) and cos($\Delta\phi$). Subsequently, the phase detector in the second embodiment provides to the phase shifter the control voltages CV1 and CV2, which correspond to sin($\Delta\phi$) and cos($\Delta\phi$), respectively. At this point, the phase detector increases, decreases, or keeps (i.e., continuously updates) the values of the control voltages CV1 and CV2 according to the successively computed signs of sin($\Delta\phi$) and cos($\Delta\phi$).

(2-2) Specific Exemplary Configuration of Phase Correction Apparatus

Figure 9:
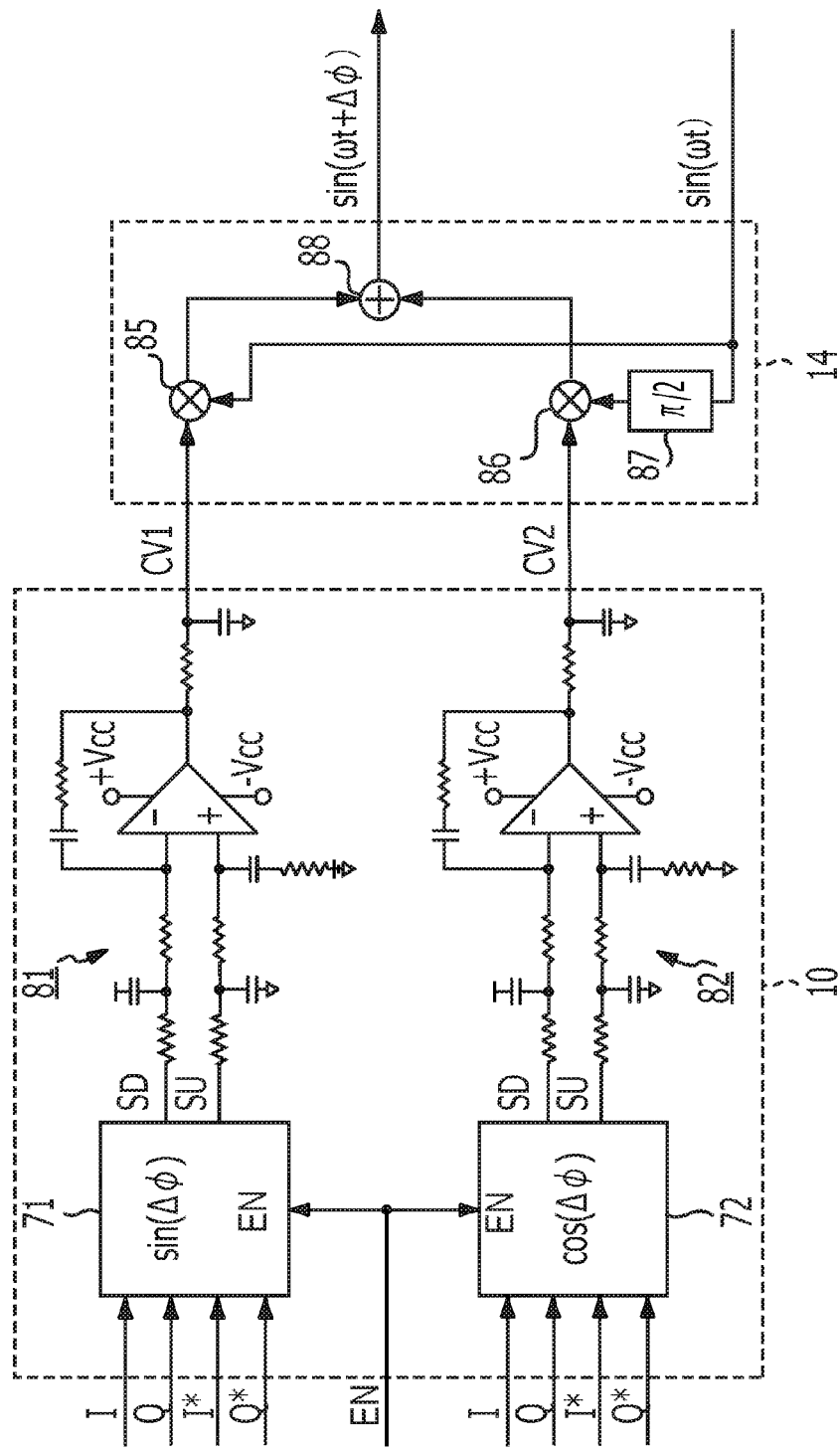
FIG. 9 is a block diagram illustrating a specific, exemplary configuration of a phase correction apparatus in the second embodiment.

A specific, exemplary configuration of the phase correction in the second embodiment will now be described with reference to FIGS. 9 and 10. FIG. 9 is a block diagram illustrating a specific, exemplary configuration of a phase correction apparatus. FIG. 10 illustrates an exemplary configuration of ROM provided in the phase detector illustrated in FIG. 9.

In order to generate the control voltages CV1 and CV2 that respectively correspond to the sine and cosine of the phase error $\Delta\phi$, the phase detector 10 illustrated in FIG. 9 is provided with two parallel sets of a digital processor and an integrator like those illustrated in FIG. 5, one set for sin($\Delta\phi$) and one set for cos($\Delta\phi$). In other words, a digital processor 71 and an integrator 81 are provided in order to generate the control voltage CV1, while a digital processor 72 and an integrator 82 are provided in order to generate the control voltage CV2. The digital processor 71 and the digital processor 72 may adopt circuit layouts similar to that of the digital processor 50 illustrated in FIG. 5. The integrator 81 and the integrator 82 may adopt circuit layouts similar to that of the integrator 60 illustrated in FIG. 5 (for inputs and outputs, see FIG. 7).

The respective content of the internal ROM units differ between the digital processor 71 and the digital processor 72. The digital processor 71 corresponds to $\sin(\Delta\phi)$, and thus, as illustrated in FIG. 10, the content of its ROM is the same as that illustrated in FIG. 6. The digital processor 72 corresponds to $\cos(\Delta\phi)$, and the content of its ROM is as illustrated in FIG. 10. Herein, the ROM units included in the digital processor 71 and the digital processor 72 correspond to a second memory.

Hereinafter, the content of the ROM in the digital processor 72 will be described. As illustrated in FIG. 10, the ROM provided in the digital processor 72 stores the 2-bit data $D_0$ and $D_1$ for each ROM address. 2-bit data $D_0$ and $D_1$ (i.e., logic levels) corresponding to a ROM address set by the decoder is successively output from the ROM. The data in the ROM is set according to the following standard. As illustrated in FIG. 10, the value of the control voltage CV2 ($\cos(\Delta\phi)$) is determined to be increased by a predetermined amount, decreased by a predetermined amount, or kept the same, according to the outputs from the individual comparators. When the sign of $\cos(\Delta\phi)$ is positive (+), the output data from the ROM is set to be $D_0$=1 and $D_1$=0, with SU=1 and SD=0 being output from the buffers. When the sign of $\cos(\Delta\phi)$ is negative (−), the output data from the ROM is set to be $D_0$=0 and $D_1$=1, with SU=0 and SD=1 being output from the buffers. When the sign of $\cos(\Delta\phi)$ is indefinite, the output data is set to be $D_0$=X and $D_1$=X (i.e., both are set to high impedance), with both SU and SD becoming high impedance.

Operation of the digital processor 71 and the digital processor 72 by an enable signal is similar to that of the digital processor 50 illustrated in FIG. 5.

In FIG. 9, the phase shifter 14 is provided with a mixer 85, a mixer 86, a $\pi/2$ phase shifter 87, and an adder 88. The mixer 85 multiplies the control voltage CV1 corresponding to $\sin(\Delta\phi)$ by the carrier wave signal $\sin(\omega t)$ from the local oscillator 91. The mixer 86 multiplies the control voltage CV2 corresponding to $\cos(\Delta\phi)$ by a signal obtained by phase-shifting the carrier wave signal $\sin(\omega t)$ from the local oscillator 91 by $\pi/2$. The adder 88 adds together the output signals from the mixer 85 and the mixer 86, thereby generating the signal $\sin(\omega t+\Delta\phi)$, which is equivalent to the carrier wave signal $\sin(\omega t)$ phase-shifted by $\Delta\phi$. The processing in the phase shifter 14 herein is equivalent to the computation expressed in Eq. 4. Since the phase shifter 14 executes processing based on the values of both $\sin(\Delta\phi)$ and $\cos(\Delta\phi)$, it is possible to conduct phase shifting with respect to target correction amounts over the entire range from 0 to $2\pi$ (i.e., the phase shifter 14 may be an endless phase shifter).

(2-3) Phase Correction Operation

Phase correction operation in the wireless transmitter in the second embodiment will now be described, primarily with reference to FIGS. 3 and 9. Referring now to FIG. 3, in the wireless transmitter in the second embodiment, the transmission baseband signal (in-phase component I, quadrature component Q) is first modulated by the quadrature modulator 40, amplified to a desired level by the power amplifier 90, and then broadcast. At this point, non-linear distortion is compensated for in the power amplifier 90, and thus the output signal RF_OUT from the power amplifier 90 is taken by the directional coupler 93 and fed back as the RF signal y(t) (i.e., Cartesian feedback). The signal fed back into the quadrature demodulator 30 is delayed compared to the output signal from the quadrature modulator 40, due to feedback-related delay elements. Consequently, phase error might be produced between the transmission baseband signal (in-phase component I, quadrature component Q) and the fed-back baseband signal (in-phase component I*, quadrature component Q*) obtained by the quadrature demodulator 30. In order to correct such phase error, the respective signal components are first input into the phase detector 10.

Referring now to FIG. 9, in the phase detector 10, the respective input signal components (I, Q, I*, Q*) are first binarized (i.e., digitized) in the digital processors 71 and 72 by being compared to predetermined threshold values. Data is also stored in advance in the ROM provided in the digital processor 71. Given a phase error of $\Delta\phi$, such data indicates whether to increase, decrease, or keep the value of $\sin(\Delta\phi)$, based on combinations of the digitized signal components (see FIG. 10). Likewise, data is also stored in advance in the ROM provided in the digital processor 72. Given a phase error of $\Delta\phi$, such data indicates whether to increase, decrease, or keep the value of $\cos(\Delta\phi)$, based on combinations of the digitized signal components (see FIG. 10). In the digital processors 71 and 72, respectively, the individual component signals (I, Q, I*, Q*) are successively acquired, and the corresponding 2-bit data ($D_0$, $D_1$) is acquired from the ROM. This ROM data is respectively supplied to the integrators 81 and 82 via buffers as signals of predetermined amplitude level (i.e., signals with the same logic level as the ROM data). In the integrators 81 and 82, the output voltages (i.e., the control voltages CV1 and CV2) are increased, decreased, or kept the same (i.e., continuously updated) with respect to the phase shifter 14, based on the signals from the digital processors 71 and 72. In this way, given a phase error of $\Delta\phi$, control voltages CV1 and CV2 corresponding to the values of $\sin(\Delta\phi)$ and $\cos(\Delta\phi)$ are provided to the phase shifter 14.

The phase shifter 14 phase-shifts the carrier wave signal $\sin(\omega t)$ from the local oscillator 91 based on the control voltages CV1 and CV2, which correspond to the values of $\sin(\Delta\phi)$ and $\cos(\Delta\phi)$. The phase shifter 14 thus generates a carrier wave signal $\sin(\omega t+\Delta\phi)$ with respect to the quadrature modulator 40. In so doing, the phase of the carrier wave signal provided to the quadrature modulator 40 is corrected.

As described above, when detecting the phase error in the wireless transmitter of the second embodiment, both a transmission baseband signal (in-phase component I, quadrature component Q) as well as a fed-back baseband signal (in-phase component I*, quadrature component Q*) are digitized (i.e., binarized). Subsequently, the sine $\sin(\Delta\phi)$ and the cosine $\cos(\Delta\phi)$ of the phase error $\Delta\phi$ is detected based on the digitized signals, and the phase of the carrier wave signal is corrected based on control voltages that correspond to $\sin(\Delta\phi)$ and $\cos(\Delta\phi)$. Consequently, in addition to the stabilization of operation due to digitization, both the sine $\sin(\Delta\phi)$ and the cosine $\cos(\Delta\phi)$ of the phase error $\Delta\phi$ are detected, and thus an endless phase shifter is realized. According to the phase correction apparatus and phase correction methods in the first and second embodiments of the disclosure, the stability of phase correction operations is improved. Herein, the distortion compensation apparatus in the first and second embodiments is described, by way of example, as shifting the phase of the carrier wave signal provided to the quadrature modulator 40 (i.e., the first carrier wave signal). However, the phase shifting target is not limited to being the first carrier wave signal. The phase shifting target may also be the transmission baseband signal, the fed-back baseband signal, or the carrier wave signal provided to the quadrature demodulator 30 (i.e., the second carrier wave signal).

In addition, the specific circuit layouts referenced in the description of the second embodiment are merely examples given for the sake of explanation, and it may be appreciated that other circuit layouts provided with similar functions may be substituted. For example, the integrators illustrated in FIGS. 5 and 9 are merely examples, and identical functions may also be realized by a digital circuit. In such a case, the digital circuit may be provided with a counter that increments or decrements according to the level of a signal from the digital processor 50, as well as other components such as a digital/analog converter (DAC). The integrators illustrated in FIGS. 5 and 9 herein add or subtract using the analog level of signals (i.e., the voltages of the logic levels) output from the digital processors. For this reason, the integrators illustrated in FIGS. 5 and 9 herein are economical, in that they omit a DAC.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustration of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A phase correction apparatus in a wireless transmitter for converting a first signal into a wireless signal and amplifying the wireless signal by a power amplifier, the phase correction apparatus comprising:
   a quadrature modulator configured to modulate an in-phase component and a quadrature component of the first signal by a first carrier wave signal;
   a quadrature demodulator configured to demodulate a returned signal returned from an output of the power amplifier by a second carrier wave signal, and generate a second signal that includes an in-phase component and a quadrature component;
   a phase detector configured to binarize the in-phase components and the quadrature components of the first and second signals according to signal levels including comparing each of the in-phase components and the quadrature components to a respective predetermined threshold value, and detect a phase error between the first signal and the second signal based on combinations of the binarized signal components in the first signal and the second signal; and
   a phase shifter configured to phase-shift the first signal, the second signal, the first carrier wave signal, or the second carrier wave signal, based on the phase error, wherein
   the phase detector includes a memory that stores information indicating whether to increase, decrease, or keep a sine value of the phase error, in accordance with combinations of the binarized signal components in the first signal and the second signal, and
   the phase detector continuously updates the sine value of the phase error by referencing the memory based on the continuously binarized signal components in the first signal and the second signal, respectively.

2. The phase correction apparatus according to claim 1, wherein
   the phase detector includes a memory that stores information indicating whether to increase, decrease, or keep a sine value and a cosine value of the phase error, in accordance with combinations of the binarized signal components in the first signal and the second signal, and
   the phase detector continuously updates the sine value and the cosine value of the phase error by referencing the memory based on the continuously binarized signal components in the first signal and the second signal, respectively.

3. A phase correction method in a wireless transmitter for converting a first signal into a wireless signal and amplifying the wireless signal by a power amplifier, the phase correction method comprising the steps of:
   modulating an in-phase component and a quadrature component of the first signal by a first carrier wave signal;
   generating a second signal that includes an in-phase component and a quadrature component by demodulating a returned signal returned from an output of the power amplifier by a second carrier wave signal;
   binarizing the in-phase components and the quadrature components of the first and second signals according to signal levels including comparing each of the in-phase components and the quadrature components to a respective predetermined threshold value, and detecting a phase error between the first signal and the second signal based on combinations of the binarized signal components in the first signal and the second signal; and
   phase-shifting the first signal, the second signal, the first carrier wave signal, or the second carrier wave signal, based on the phase error, wherein
   detecting the phase error includes a step of continuously updating a sine value of the phase error by referencing a memory that stores information indicating whether to increase, decrease, or keep the sine of the value of the phase error, in accordance with combinations of the binarized signal components in the first signal and the second signal, respectively.

4. The phase correction method according to claim 3, wherein
   detecting the phase error includes a step of continuously updating a sine value and a cosine value of the phase error by referencing a memory that stores information indicating whether to increase, decrease, or keep the sine value and the cosine value of the phase error, in accordance with combinations of the binarized signal components in the first signal and the second signal, respectively.

* * * * *